United States Patent
Segawa et al.

[11] Patent Number: 5,955,925
[45] Date of Patent: Sep. 21, 1999

[54] DIGITAL AGC CIRCUIT

[75] Inventors: Yuji Segawa; Kunihiko Gotoh, both of Kawasaki, Japan

[73] Assignee: Fujitsu Limited, Kanagawa, Japan

[21] Appl. No.: 08/972,033

[22] Filed: Nov. 17, 1997

[30] Foreign Application Priority Data

May 19, 1997 [JP] Japan ..................................... 9-128707

[51] Int. Cl.$^6$ .................................................. H03G 3/30
[52] U.S. Cl. .......................................... 330/279; 330/282
[58] Field of Search .................................... 330/124, 136, 330/278, 279, 282

[56] References Cited

U.S. PATENT DOCUMENTS

| | | | |
|---|---|---|---|
| 5,036,527 | 7/1991 | Halim et al. | 330/279 X |
| 5,051,707 | 9/1991 | Fujita | 330/279 |
| 5,117,201 | 5/1992 | Luther | 330/279 |

FOREIGN PATENT DOCUMENTS

61-263304  11/1986  Japan .

*Primary Examiner*—Steven J. Mottola
*Attorney, Agent, or Firm*—Nikaido Marmelstein Murray & Oram LLP

[57] ABSTRACT

An AGC circuit according to the present invention comprises: a gain controller, having a variable gain, for amplifying an input signal at a predetermined gain and generating an output signal, and for varying the gain; a comparison circuit for comparing an amplitude of the input signal or of the output signal with a predetermined reference level, and for generating a control signal that goes to a first level when the amplitude is smaller than the reference level, and that goes to a second level when the amplitude is greater than the reference level; and a duty ratio detector for supplying the control signal generated by the comparison circuit, and for generating control code in accordance with a duty ratio of the control signal, wherein the gain of the gain controller is varied by using the control code, and so adjusted that the duty ratio of the control signal is maintained to be a predetermined value. When the amplitude of the input signal or the output signal is increased, a period during which the amplitude exceeds the reference level is also extended. By utilizing this phenomenon, a gain is varied so as to maintain a control signal duty ratio of 50%, for example, so that the amplitude of the output signal is amplified to a desired value, which is maintained.

4 Claims, 7 Drawing Sheets

| D1 | D0 | S1  S2  S3  S4   | GAIN | |
|----|----|------------------|------|---|
| 0 | 0 | ON  OFF OFF OFF | $\dfrac{R1}{R0}$ | (0dB) |
| 0 | 1 | OFF ON  OFF OFF | $\dfrac{R1+R2}{R0}$ | (+10dB) |
| 1 | 0 | OFF OFF ON  OFF | $\dfrac{R1+R2+R3}{R0}$ | (+20dB) |
| 1 | 1 | OFF OFF OFF ON  | $\dfrac{R1+R2+R3+R4}{R0}$ | (+30dB) |

DIGITAL AGC CIRCUIT

BACKGROUND OF THE INVENTION

The present invention relates to an AGC (Automatic Gain Control) circuit, and in particular to an AGC circuit which is digitized so that it is appropriate for integration.

An AGC circuit is employed for wireless portable radio devices, such as radios, portable telephones, car telephones and cordless telephones, for example, wherein a received high-frequency signal is dropped to an intermediate-frequency signal by a local frequency, and the intermediate-frequency signal is amplified to acquire a signal having a constant amplitude, so that demodulation can be stably performed. That is, in the AGC circuit, the amplitude of a signal which is obtained by amplifying an intermediate-frequency signal is monitored, and the gain of an amplifier is so controlled that the amplitude of an output signal after amplification is constant.

Figure 10:
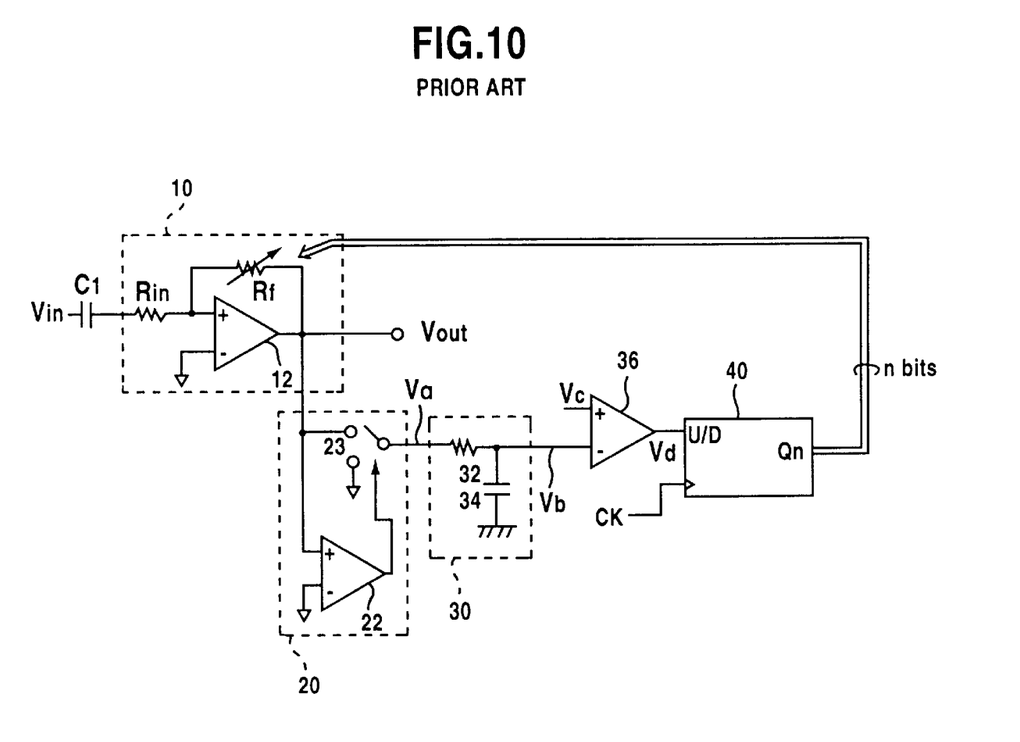
FIG. 10 is a circuit diagram illustrating a conventional AGC circuit.

FIG. 10 is a circuit diagram showing a common, conventional AGC circuit. This AGC circuit comprises: an amplifier 10 having a digitally controlled gain G; a rectifier 20 for rectifying an output Vout of the amplifier 10; a smoothing circuit 30 for smoothing an output Va of the rectifier 20; a comparator 36 for comparing an output Vb of the smoothing circuit 30 with a constant voltage Vc; and an up-down counter 40 for incrementing or decrementing a count in accordance with whether an output Vd of the comparator 36 is at level H or at level L. In accordance with an n-bit output Qn of the up-down counter 40, the resistance of a feedback resistor Rf in the amplifier 10 is changed and the gain G (=−Rf/Rin) of the amplifier 10 is controlled.

Figure 11:
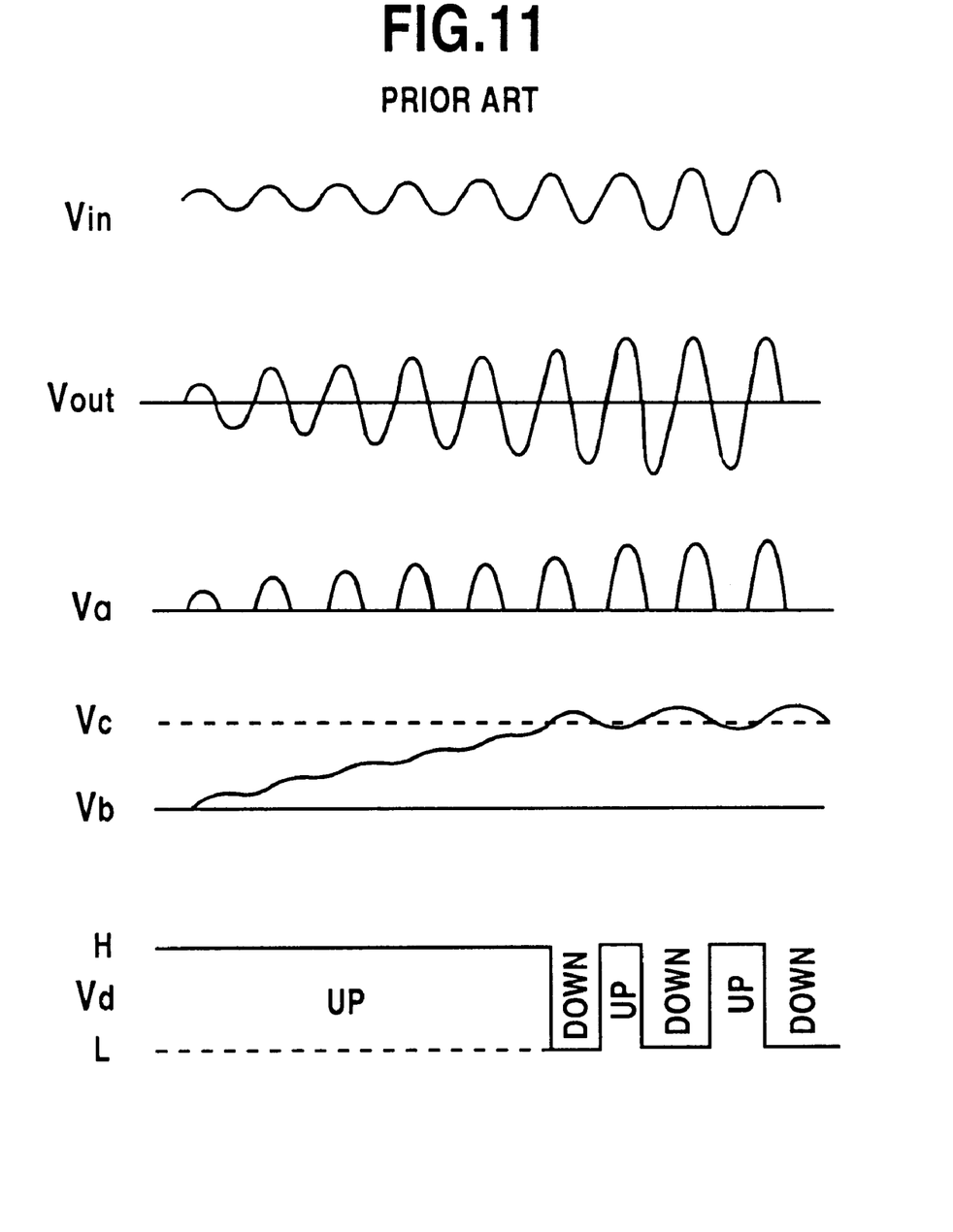
FIG. 11 is a waveform diagram showing the characteristics of the conventional AGC circuit in FIG. 10.

FIG. 11 is a waveform diagram showing the characteristic of the conventional AGC circuit in FIG. 10. As is shown in FIG. 11, a high-frequency signal Vin is input and amplified by the amplifier 10, and the signal Vout is generated and output. In this example, the amplifier 10 is an inversion amplifier having an input resistor Rin and a feedback resistor Rf. The gain G is −Rf/Rin, as is described above. The rectifier 20 employs a comparator 22 to determine whether the output signal Vout of the amplifier 10 has a positive voltage cycle or a negative voltage cycle, and permits only an output signal Vout having a positive voltage cycle to pass through a switch 23. A voltage Va that has passed through is integrated by the smoothing circuit 30, which serves as a filter and is constituted by a resistor 32 and a capacitor 34, and is transformed into a direct current voltage Vb.

The direct current voltage Vb is proportional to an average value for output signals Vout, and is compared with a predetermined constant voltage Vc by the comparator 36. When the DC voltage Vb is lower, a digital output Vd at level H is output, and when the DC voltage Vb is higher, digital output Vd at level L is output. In accordance with the level of the digital output Vd, a count is incremented or decremented by the up-down counter 40. For example, when the output Vd is at level H, the count is incremented, and the value of the feedback resistor Rf is adjusted by an output Qn to increase the gain G of the amplifier 10. However, when the output Vd is at level L, the count is decremented, and the value of the feedback resistor Rf is adjusted by the output Qn to reduce the gain G of the amplifier 10. As a result, the gain G of the amplifier 10 is so controlled that the output signal Vout amplitude is constant.

Since the conventional AGC circuit shown in FIG. 10 monitors the amplitude of an output signal Vout obtained by amplification and controls the gain of the amplification, analog circuits, such as a rectifier and a smoothing circuit, must be employed. In general, the size of these analog circuits tends to be larger than that of digital circuits.

In addition, as is shown in FIG. 11, the output Vb of the smoothing circuit 30 includes a ripple effect that fluctuates above and below a reference voltage Vc. When the input Vin is a low-frequency signal, the output Vout, which is obtained by amplifying the input Vin, is also a low-frequency signal, and the above described ripple effect is increased. In order to prevent this, at the smoothing circuit 30, which is a low-pass filter, a cutoff frequency fc (=½πRC) must be reduced. To reduce the cutoff frequency fc, however, the resistance of the resistor 32 or the capacitance of the capacitor 43 must be increased.

When the resistance or the capacitance at the smoothing circuit 30 is increased, first, the size of the circuit is enlarged, which constitutes a barrier to integration. Second, the charging and the discharging in the smoothing circuit requires an extended period of time, and the response of the AGC circuit is deteriorated.

Therefore, an AGC circuit is demanded that is appropriate for integration while maintaining the response of the AGC circuit is demanded.

SUMMARY OF THE INVENTION

It is, therefore, one object of the present invention to provide an AGC circuit that is appropriate for integration.

It is another object of the present invention to provide an AGC circuit that can be constituted by a small circuit without deterioration of the response by the AGC circuit.

To achieve the above objects, an AGC circuit according to the present invention comprises:

a gain controller, having a variable gain, for amplifying an input signal at a predetermined gain and generating an output signal, and for varying the gain;

a comparison circuit for comparing an amplitude of the input signal or of the output signal with a predetermined reference level, and for generating a control signal that goes to a first level when the amplitude is smaller than the reference level, and that goes to a second level when the amplitude is greater than the reference level; and a duty ratio detector for supplying the control signal generated by the comparison circuit, and for generating control code in accordance with a duty ratio of the control signal, wherein the gain of the gain controller is varied by using the control code, and so adjusted that the duty ratio of the control signal is maintained to be a predetermined value.

When the amplitude of the input signal or the output signal is increased, a period during which the amplitude exceeds the reference level is also extended. By utilizing this phenomenon, a gain is varied so as to maintain a control signal duty ratio of 50%, for example, so that the amplitude of the output signal is amplified to a desired value, which is maintained.

DETAILED DESCRIPTION OF THE PREFERRED EMBODIMENT

The preferred embodiment of the present invention will now be described while referring to the drawings. Note, however, that the technical scope of the present invention is not limited to this embodiment.

Figure 1:
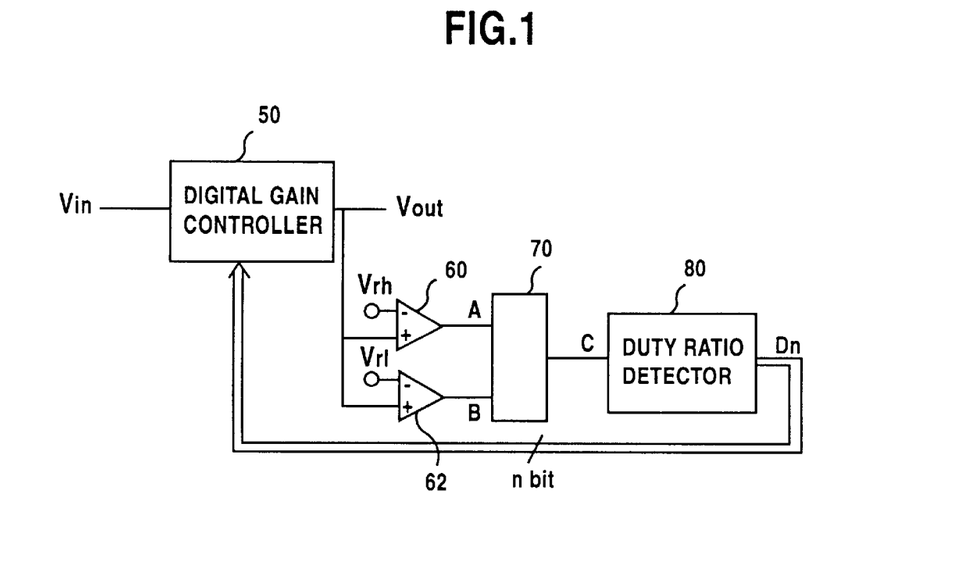
FIG. 1 is a schematic circuit diagram illustrating an AGC circuit according to one embodiment of the present invention.
Figure 2:
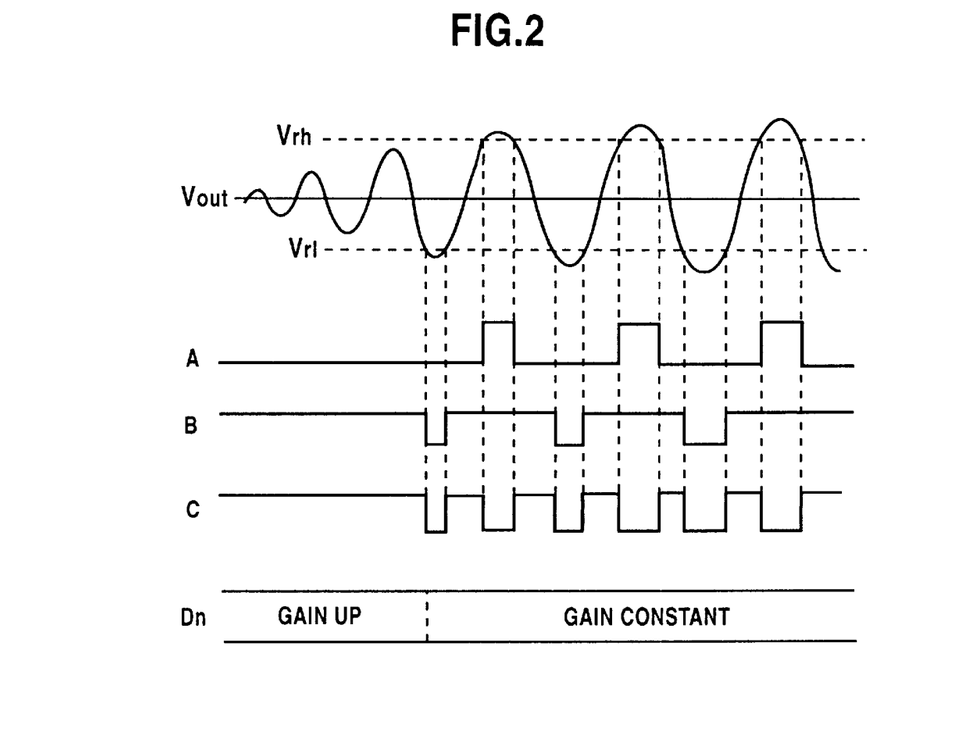
FIG. 2 is a signal waveform diagram for the AGC circuit in FIG. 1.

FIG. 1 is a schematic circuit diagram illustrating an AGC circuit according to the embodiment of the present invention. FIG. 2 is a signal waveform diagram for the AGC circuit. In the AGC circuit, an input signal Vin is amplified by a digital gain controller 50 and an output signal Vout is generated. The digital gain controller 50 is an amplifier for which the gain is controlled by control code Dn. The output signal Vout is compared with a positive reference voltage Vrh and a negative reference voltage Vrl respectively by comparators 60 and 62. The output signal Vout is transmitted to positive phase input terminals of the comparators 60 and 62, while the positive reference voltage Vrh and the negative reference voltage Vrl are provided respectively for the negative phase input terminals of the comparators 60 and 62. The comparators 60 and 62 may compare the input signal Vin with a predetermined reference voltage because, by controlling the gain in accordance with the amplitude of an input signal, the amplitude of an output signal can be adjusted to a desired value.

As is shown in FIG. 2, so long as the level of the output signal Vout is between the reference voltages Vrh and Vrl, outputs A and B of the comparator 60 and 62 go to level L and to level H. A signal C is driven to level H by a logical circuit 70. When the output signal Vout reaches a level higher than the reference voltage Vrh, the output A of the comparator goes to level H. When the level of the output signal Vout goes lower than the reference voltage Vrl, the output B of the comparator 62 goes to level L. When the logic of the logical circuit 70 is defined as C=/A+B, as is shown in FIG. 2, the control signal C is at level H during a period in which the magnitude of the output signal Vout is neither higher than the reference voltage Vrh nor lower than the reference voltage Vrl, and is at level L during a period in which the magnitude of the output signal Vout is higher than the reference voltage Vrh or lower than the reference voltage Vrl. The operation of the comparator is equivalent to the processing during which the output C goes to level L when the amplitude of the output signal Vout exceeds the reference voltage, and goes to level H when the amplitude is within the reference voltage.

A duty ratio detector 80 monitors the duty ratio (i.e., duty cycle) of the control signal C. When the duty ratio is high, which means the amplitude of the output signal Vout is small, the duty ratio detector 80 changes the control code Dn to increase the gain of the gain controller 50. When the duty ratio of the control signal C is low, which means the amplitude of the output signal Vout is too large, the duty ratio detector changes the control code Dn to reduce the gain of the gain controller 50. When the duty ratio of the control signal C is at a adequate level, which means the amplitude of the output signal Vout is satisfactory, the duty ratio detector 80 sets a constant control code Dn to maintain the gain of the gain controller 50.

That is, for the AGC circuit in this embodiment the principle is applied that a period, in which the amplitude of the output signal Vout is higher than the reference voltage Vrh or lower than the reference voltage Vrl, is long when the amplitude of the output signal Vout after amplification is large, so that the monitoring of that period using the duty ratio of the control signal C is employed as the basic principle. The gain is controlled by the digital circuit without a conventional analog circuit, such as a rectifier or a smoothing circuit, being required. Therefore, an AGC circuit appropriate for integration can be provided without deterioration of the sensitivity of the AGC circuit.

Figure 3:
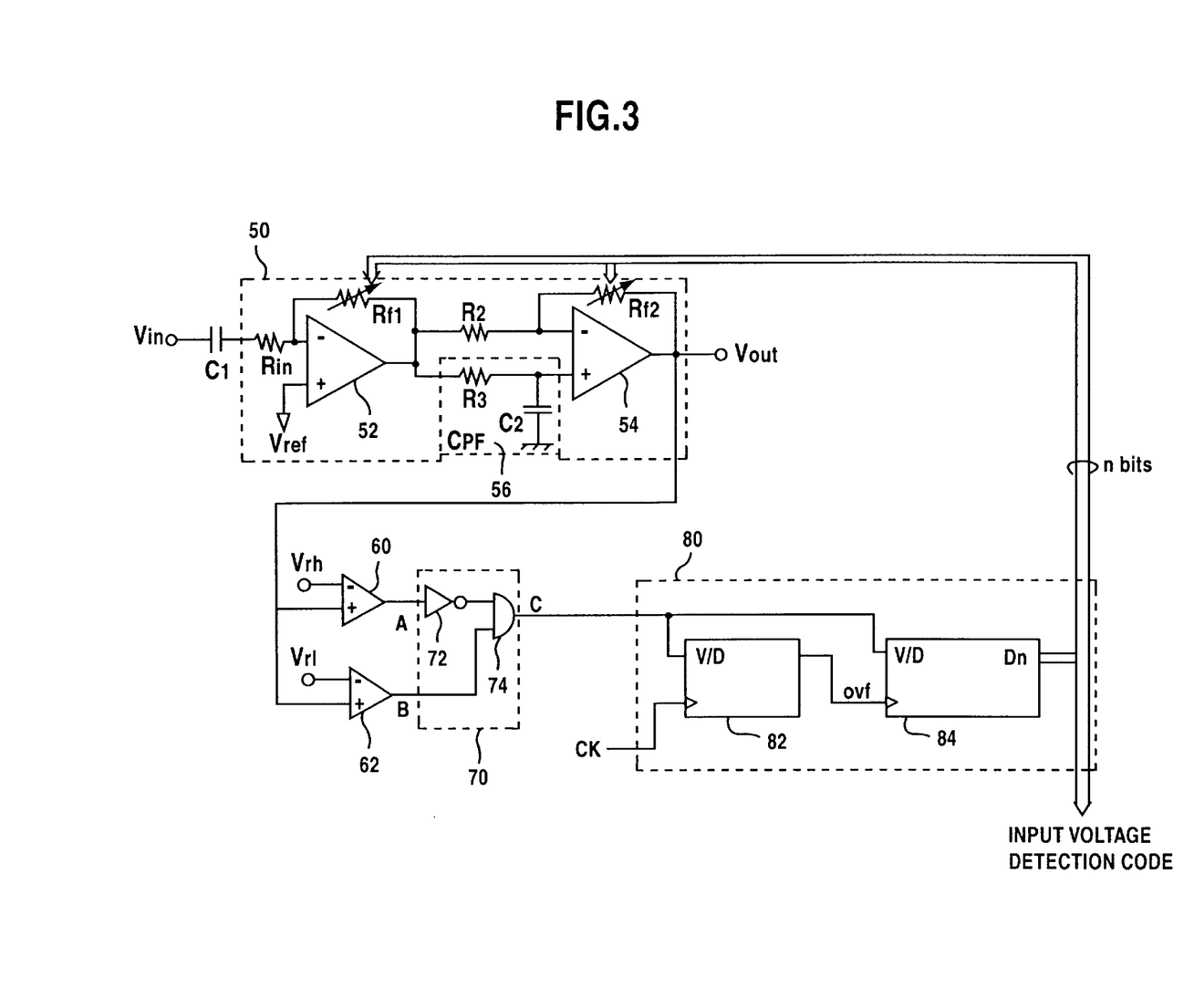
FIG. 3 is a more specific circuit diagram illustrating the AGC circuit.
Figure 4:
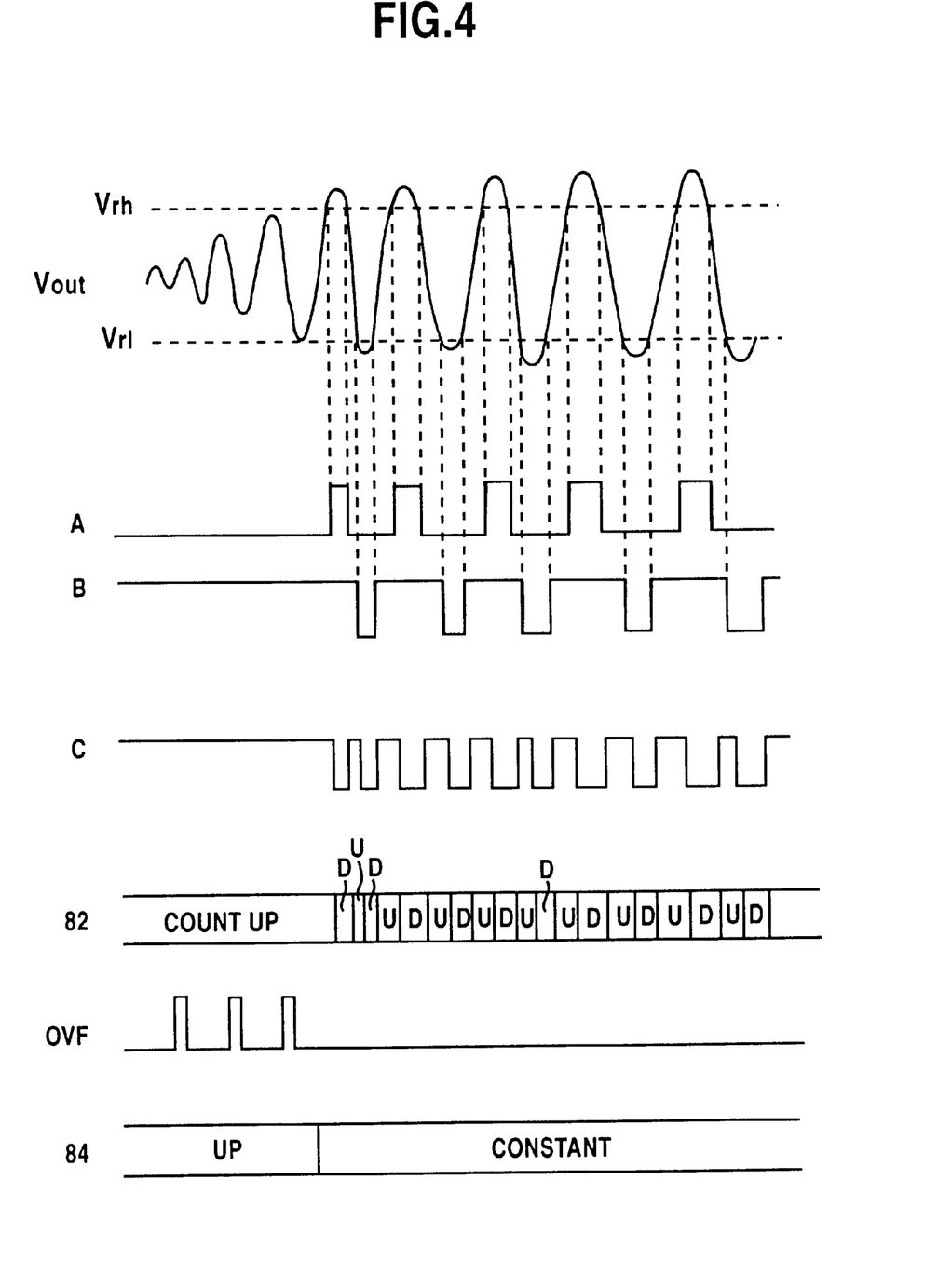
FIG. 4 is a signal waveform diagram for the AGC circuit in FIG. 3.

FIG. 3 is a more specific circuit diagram for the AGC circuit in FIG. 1. The same reference numerals as are used in FIG. 1 are also used to denote corresponding or identical components. FIG. 4 is a signal waveform diagram for the AGC circuit in FIG. 3. A high-frequency input signal Vin is supplied via an input capacitor C1 to the gain controller 50, which is an amplifier. In this example circuit, the gain controller 50 includes inversion type operational amplifiers 52 and 54. The inversion type amplifier 52 has an input resistor Rin and a feedback resistor Rf1. The inversion amplifier 54 at the second stage has an input resistor R2 and a feedback resistor Rf2. The resistances of the feedback resistors Rf1 and Rf2 are varied digitally by the gain control code Dn. Since the feedback resistors Rf1 and Rf2 are variably controlled, the input impedances of the operational amplifiers 52 and 54 are maintained constant and their gains are varied.

A low-pass filter 56, constituted by a resistor R3 and a capacitor C2, is provided at the positive-phase input terminal of the operational amplifier 54 in the second stage to cancel an input offset voltage of the operational amplifier 54.

In the logical circuit 70 are an inverter 72 and an AND gate 74 for generating the above described logic C=/A+B. The logical circuit is, for example, a CMOS circuit.

The duty ratio detector 80 includes, for example, an up-down counter 82 in its front stage and an up-down counter 84 in its rear stage, as is shown in FIG. 3. The up-down counter 82 in the front stage receives a clock CK at its clock input terminal, and increments or decrements a count value in accordance with the logic of the control signal C. The up-down counter 84 in the rear stage receives, at its clock input terminal, an overflow signal OVF from the up-down counter 82 in the front stage, and increments or decrements a count value in accordance with the logic of the control signal C. The n-bit output Dn of the up-down counter 84 in the rear stage is employed to variably control the feedback resistors Rf1 and Rf2 of the gain controller 50.

In this embodiment, the duty ratio of the control signal C, which is the output of the logical circuit 70, is so controlled that it is maintained at 50%. Since, at the duty ratio of 50% for the control signal C, the incremented count value held by the up-down counter 82 equals the decremented count value, an overflow or an underflow does not occur, and the overflow output OVF does not change. As a result, the output of the up-down counter 84 in the rear stage is constant and the control code Dn do not vary, and the feedback resistors Rf1 and Rf2 do not change. If the duty ratio of the control signal C is not 50%, the up-down counter 84 increments or decrements the count value to change the control code Dn, with which the gain is adjusted, so that the duty ratio of the control signal C is adjusted closer to 50%.

As a result, the output signal Vout is so controlled that it has a constant amplitude corresponding to the levels of the reference voltages Vrh and Vrl.

As is shown in the signal waveform diagram in FIG. 4, during a period in which the amplitude of the output signal Vout is small, the up-down counter 82 in the front stage continues count value incrementation until an overflow signal OVF periodically occurs, and then, the up-down counter 84 in the rear stage begins to perform count value incrementation. Subsequently, the gain of the gain controller 50 is increased. When the output signal Vout rises above or drops below the reference voltage Vrh or Vrl, the duty ratio of the control signal C approaches 50%, and the up-down counter 82 in the front stage alternately repeats the count value incrementation and decrementation, so that an overflow signal OVF does not occur. As a result, the up-down counter 84 in the rear stage does not perform count incrementation and both the output Dn and the gain are maintained constant.

Figure 5:
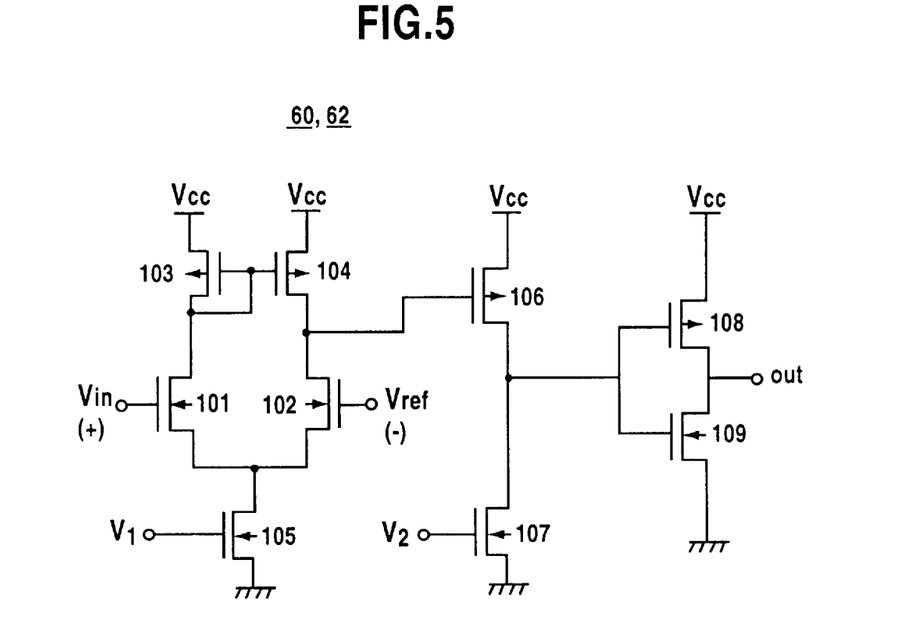
FIG. 5 is a diagram showing a specific circuit example for comparators.

FIG. 5 is a specific circuit diagram for the comparators 60 and 62. In this example, N type transistors 101 and 102 are connected at their sources, to which is supplied a constant current from a transistor 105. P type transistors 103 and 104 form a load circuit. An input Vin is transmitted to the gate of the transistor 101, while a reference voltage Vref is applied to the gate of the transistor 102. In the example for the comparators 60 and 62, therefore, the positive-phase input terminal is located on the Vin side, and the negative-phase input terminal is located on the Vref side. The output of a differential circuit of the transistors 101 and 102 is amplified by the amplification stages of a P type transistor 106 and an N type transistor 107, and the amplified output is transmitted through a CMOS inverter, which is composed of a P type transistor 108 and an N type transistor 109. In this fashion, the output out is generated. V1 and V2 are bias voltages.

It should be noted that each of the operational amplifiers 52 and 54 can be constituted by a comparator 60 or 62 shown in FIG. 5, by excluding the inverter circuits 108 and 109 in the final stage.

Figure 6:
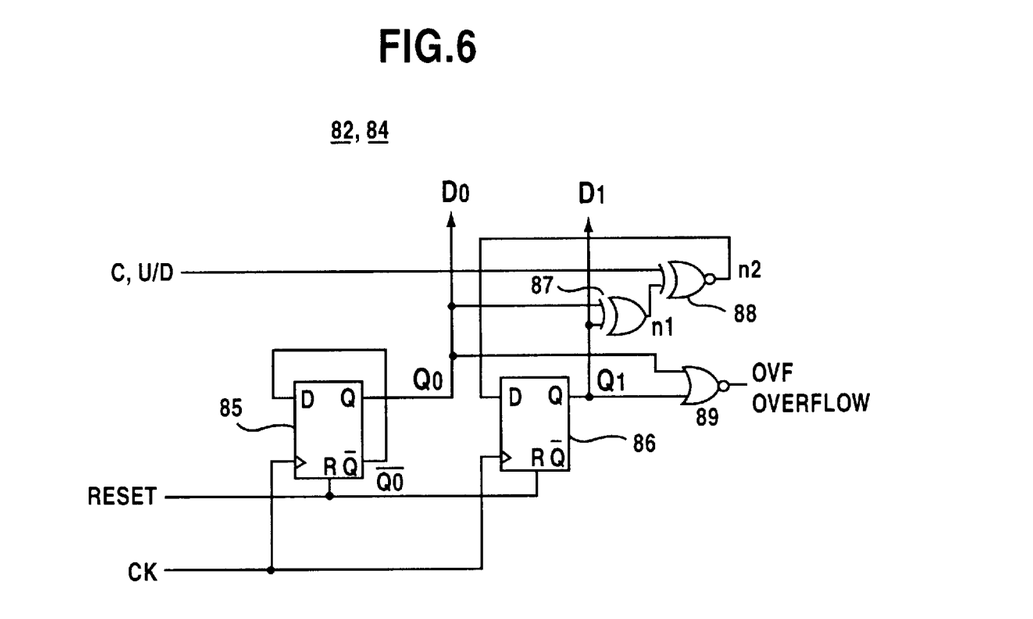
FIG. 6 is a diagram showing an circuit example for up-down counters.

FIG. 6 is a circuit diagram for the up-down counters 82 and 84. This example shows a 2-bit counter. The counter 82 or 84 includes D flip-flops 85 and 86, an XOR gate 87 for acquiring an XOR of non-inverted outputs Q0 and Q1, and an XNOR gate 88 for acquiring an XNOR of the XOR output and the output at an up-down control terminal U/D. The output of the XNOR gate 88 is transmitted to input terminal D of the D flip-flop 86. Further, a NOR gate 89 acquires an OR of the non-inverted output Q0 and Q1 of the D flip-flops 85 and 86, thereby generating an overflow output OVF.

Since an inverted output /Q is received at the D input of the D flip-flop 85 on the lower bit side, upon the receipt of a clock CK, its output Q0 goes alternately to level H and level L. To explain the operation of the up-down counter, first, assume that the outputs D0 and D1 are at level L (logic 0). An output n1 of the XOR gate 87 is at level L, while an output n2 of the XNOR gate 88 is at level L if the control signal C is at level H.

Upon receipt of the first clock CK, the output Q0 of the D flip-flop 85 goes to level H. However, since output n2 is at level L, the output Q1 of the D flip-flop 86 is held at level L. Since the output Q0 is at level H and the output Q1 is at level L, the output n1 of the XOR gate 87 goes to level H. Accordingly, the output n2 of the XNOR gate 88 goes to level H.

Upon the receipt of the second clock CK, the output Q0 of the D flip-flop 85 goes to level L. Since the output n2 is at level H, the output Q1 of the D flip-flop 86 goes to level H. Since the output Q0 is at level L and the output Q1 is at level H, the output n1 of the XOR gate 87 is not changed, i.e., is held at level H, and accordingly, the output n2 of the XNOR gate 88 is not changed and is held at level H.

Upon the receipt of the third clock CK, the output Q0 of the D flip-flop 85 goes to level H. Since the output n2 is held at level H, the output Q1 of the D flip-flop 86 is also held at level H. Since the output Q0 is at level H and the output Q1 is also at level H, the output n1 of the XOR gate 87 is changed to level L, and accordingly, the output n2 of the XNOR gate 88 is also changed to level L.

Upon the receipt of the fourth clock CK, the outputs Q0 and Q1 of the D flip-flops 85 and 86 are returned to level L. At this time, the output of the NOR gate 89 goes to level H, and accordingly, the overflow output OVF goes to level H.

When the control signal C for level L is received, the up-down counter 82 or 84 performs decrementation of a count value, and in response to the fourth clock CK, the overflow output OVF goes to level H. As is described above, incrementation or decrementation is performed as a four clock cycle.

When the up-down counter shown in FIG. 6 is employed as the counter 82 in the first stage in FIG. 3, an overflow output is provided for the up-down counter 84 in the rear stage. When the up-down counter shown in FIG. 6 is employed as the counter 84 in the rear stage, the outputs Q0 and Q1 of the D flip-flops 85 and 86 are transmitted as control codes D0 and D1 to the gain controller 50.

Figure 7:
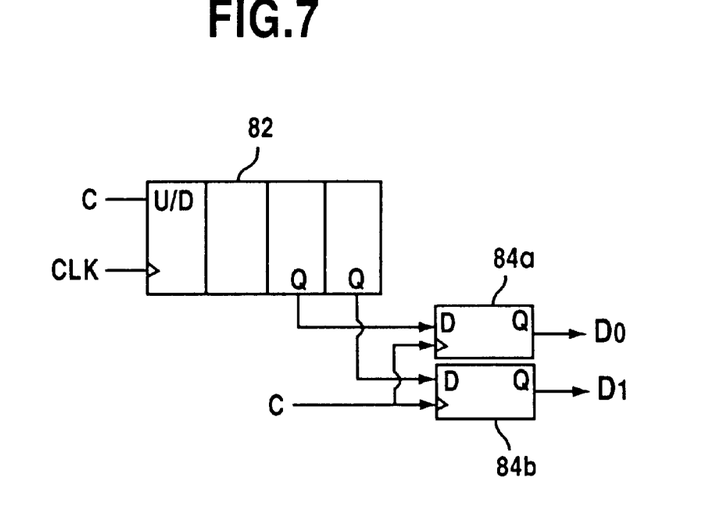
FIG. 7 is a diagram illustrating another duty ratio detector example.

FIG. 7 is a diagram illustrating another example duty ratio detector 80. This duty ratio detector 80 includes a 4-bit up-down counter 82 and flip-flops 84a and 84b for latching the upper two bits at the leading edge of the control signal C. In accordance with the level of the control signal C, the up-down counter 82 increments or decrements the count value, and the upper two bits are latched and transmitted as control code D0 and D1 to the gain controller 50.

Figure 8:
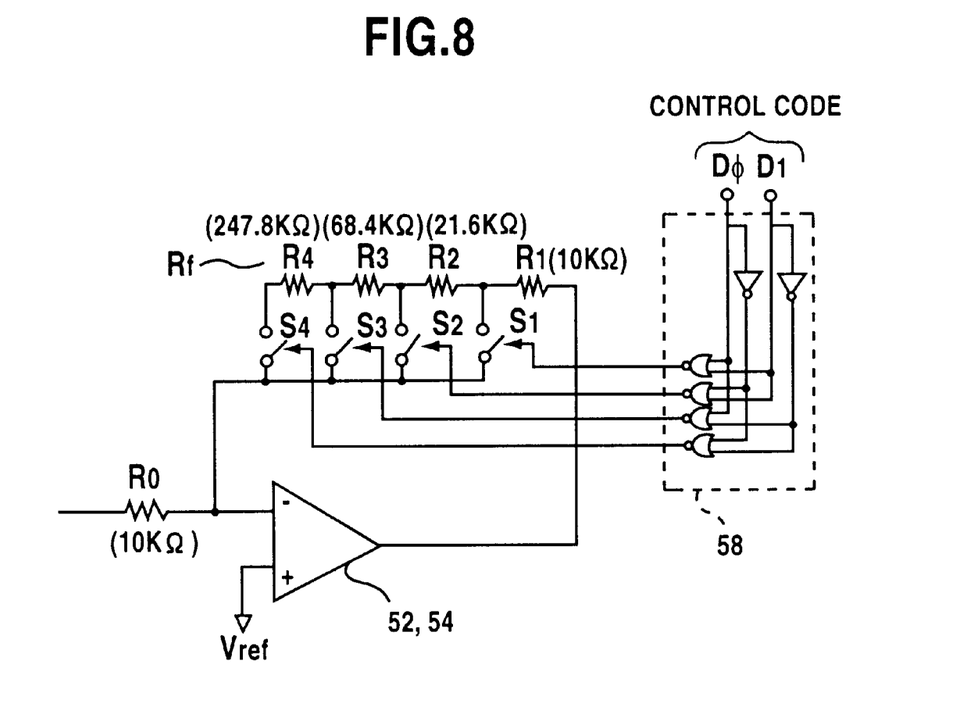
FIG. 8 is a diagram showing a specific circuit example for a feedback resistor Rf for an operational amplifier in a gain controller.
Figure 9:
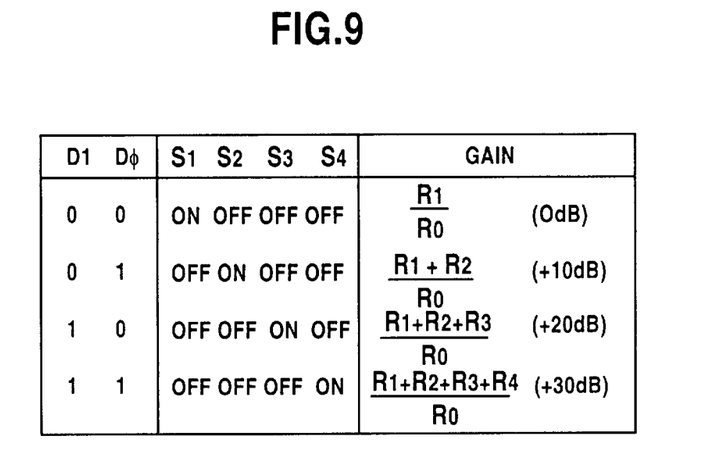
FIG. 9 is a table showing the relationship between control code and a gain.

FIG. 8 is a specific circuit diagram for the feedback resistors Rf of the operational amplifiers 52 and 54 of the gain controller 50. FIG. 9 is a table showing the relationship between the control codes and the gain.

As is shown in FIG. 8, the control codes D0 and D1 from the duty ratio detector 80 are decoded by a decoder 58, and the decoded output is transmitted to switches S1 through S4 of the feedback resistor group Rf. The decoder 58 is a common decoder which employs two inverters to generate inversion signals for the control codes D0 and D1, and employs four NOR gates to decode four combinations of the inversion signals.

The resistances of resistors R1 through R4 of the feedback resistor group Rf are set, for example, as is shown in FIG. 8. The ON/OFF states of the switches S1 through S4, relative to the combinations of the control codes D0 and D1 and their gains (Rf/Ro), are shown in the table in FIG. 9. When control codes D0 and D1 are (0, 0), the switch S1 is turned on, and the feedback resistance Rf is the resistance R1. The gain at this time is 0 dB.

When control codes D0 and D1 are (0, 1), the switch S2 is turned on and the feedback resistance Rf is the resistance R1+R2. The gain at this time is +10 dB.

Similarly, when control codes D0 and D1 are (1, 0), the switch S3 is turned on and the feedback resistance Rf is the resistance R1+R2+R3. The gain at this time is +20 dB. And then, when control codes D0 and D1 are (1, 1), the switch S4 is turned on and the feedback resistance Rf is the resistance R1+R2+R3+R4. The gain at this time is +30 dB.

When the feedback resistance is so provided as to be logarithmically equivalent, the gain of the inversion operational amplifier 52 or 54 is changed using units of 10 dB, for example. Therefore, the gain of the gain controller can be allocated equally across a wide range.

As is described above, according to the present invention, the amplitude of the output signal Vout of the gain controller is monitored, and is controlled so that the ratio of a period in which the amplitude is greater than a given reference level to a period in which it is smaller is a predetermined value, e.g., 50% in this embodiment. Therefore, a conventionally employed analog circuit, such as a rectifier or a smoothing circuit, is not required. Since the AGC circuit of the present invention can basically be constituted by a digital circuit, it is appropriate for integration. As a result, this AGC circuit is very useful for fabricating one-chip receivers for portable radio devices, etc.

What is claimed is:

1. An AGC circuit comprising:

a gain control circuit, having a gain which is variably controlled, for amplifying an input signal at the gain and for generating an output signal, a comparison circuit for comparing an amplitude of said input signal or of said output signal with a predetermined reference level, and for generating a control pulse signal that goes to a first level when said amplitude is smaller than said reference level, and that goes to a second level when said amplitude is greater than said reference level; and a duty ratio detector, being supplied with said control pulse signal generated by said comparison circuit, for generating control code in accordance with a duty ratio of said control pulse signal, wherein said gain of said gain control circuit is varied by using said control code, and so adjusted that said duty ratio of said control pulse signal is maintained to be a predetermined value.

2. An AGC circuit according to claim 1, wherein said gain control circuit includes an inversion type operational amplifier having an input resistor and a feedback resistor, and a resistance of said feedback resistor is selected in accordance with said control code.

3. An AGC circuit according to claim 1, wherein said comparison circuit includes a first comparator for comparing a level of said input signal or of said output signal with a first reference level, a second comparator for comparing a level of said input signal or of said output signal with a second reference level, which is lower than said first reference level, and a logical circuit for setting said control signal to said first level when said level of said input signal or of said output signal is located between said first and said second reference levels, and for setting said control signal to said second level when said level of said input signal or of said output signal is located beyond said first or below said second reference level.

4. An AGC circuit according to claim 1, wherein said duty ratio detector has an up-down counter for either incrementing or decrementing a count in accordance with said first level of said control signal and for either decrementing or incrementing a count in accordance with said second level of said control signal, and said control code is generated by an output of said up-down counter.

* * * * *